US010976762B2

(12) United States Patent
Loder

(10) Patent No.: US 10,976,762 B2
(45) Date of Patent: Apr. 13, 2021

(54) CONTROL OF AN ELECTRICAL POWER SYSTEM RESPONSIVE TO SENSING A GROUND FAULT

(71) Applicant: Rolls-Royce North American Technologies, Inc., Indianapolis, IN (US)

(72) Inventor: David Loder, Carmel, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 256 days.

(21) Appl. No.: 16/172,007

(22) Filed: Oct. 26, 2018

(65) Prior Publication Data

US 2020/0133319 A1 Apr. 30, 2020

(51) Int. Cl.
| | | |
|---|---|---|
| G05F 1/10 | (2006.01) | |
| G01R 31/50 | (2020.01) | |
| H02H 7/122 | (2006.01) | |
| H02J 3/38 | (2006.01) | |
| H02M 1/32 | (2007.01) | |
| H02H 11/00 | (2006.01) | |

(52) U.S. Cl.
CPC ............... *G05F 1/10* (2013.01); *G01R 31/50* (2020.01); *H02H 7/1225* (2013.01); *H02J 3/386* (2013.01); *H02M 1/32* (2013.01); *H02H 11/005* (2013.01)

(58) Field of Classification Search
CPC ..... H02H 7/1225; H02H 11/005; H02J 3/386; G01R 31/50; G05F 1/10; H02M 1/32; H02M 7/219; H02M 7/5387; H02M 2001/007; H02M 2001/0025; H02M 2001/123

USPC ......................................................... 361/93.1
See application file for complete search history.

(56) References Cited

U.S. PATENT DOCUMENTS

| 6,775,157 B2 | 8/2004 | Honda | |
|---|---|---|---|
| 7,944,091 B2 * | 5/2011 | Zacharias | ............... H02J 3/381 307/112 |
| 8,467,160 B2 | 6/2013 | West | |

(Continued)

FOREIGN PATENT DOCUMENTS

| CN | 108233332 A | 6/2018 |
|---|---|---|
| EP | 3148029 A1 | 3/2017 |

(Continued)

OTHER PUBLICATIONS

Extended European Search Report from counterpart EP Application No. 19200332.5 dated Mar. 24, 2020, 7 pgs.

(Continued)

*Primary Examiner* — Kevin J Comber
(74) *Attorney, Agent, or Firm* — Shumaker & Sieffert, P.A.

(57) ABSTRACT

In some examples, an electrical power system includes a differential bus, a power converter coupled to the differential bus, and a controller configured to control the power converter based on a first target value for the differential bus. The controller is also configured to sense that a ground fault has occurred in the electrical power system while controlling the power converter based on the first target value. The controller is further configured to, responsive to sensing that the ground fault has occurred, control the power converter based on a second target value for the differential bus, the second target value being different than the first target value.

20 Claims, 9 Drawing Sheets

(56) References Cited

U.S. PATENT DOCUMENTS

| | | |
|---|---|---|
| 9,007,735 B2 | 4/2015 | Park |
| 9,118,205 B2 | 8/2015 | Ou |
| 2013/0099571 A1 | 4/2013 | Bremicker et al. |
| 2013/0113283 A1 | 5/2013 | Shiek |
| 2013/0193766 A1 | 8/2013 | Irwin et al. |

FOREIGN PATENT DOCUMENTS

| | | |
|---|---|---|
| JP | H09308263 A | 11/1997 |
| JP | 2010130741 A | 6/2010 |

OTHER PUBLICATIONS

Madduri, "A Scalable DC Microgrid Architecture for Rural Electrification in Emerging Regions", Dec. 16, 2015, 116 pgs.
Rafter et al., "DC Ground Fault Detection Provided for Uninterruptible Power Supplies", Dec. 2008, 8 pgs.
Shunt-Based Ground Fault Protection for Inverters Powered From 220-V AC Supply, Texas Instruments, Aug. 2015, 51 pgs.
Response to Extended European Search Report from counterpart EP Application No. 19200332.5 dated Mar. 24, 2020, filed Sep. 18, 2020, 15 pgs.
Communication pursuant to Article 94(3) EPC from counterpart EP Application No. 19200332.5 dated Feb. 25, 2021, 5 pgs.

\* cited by examiner

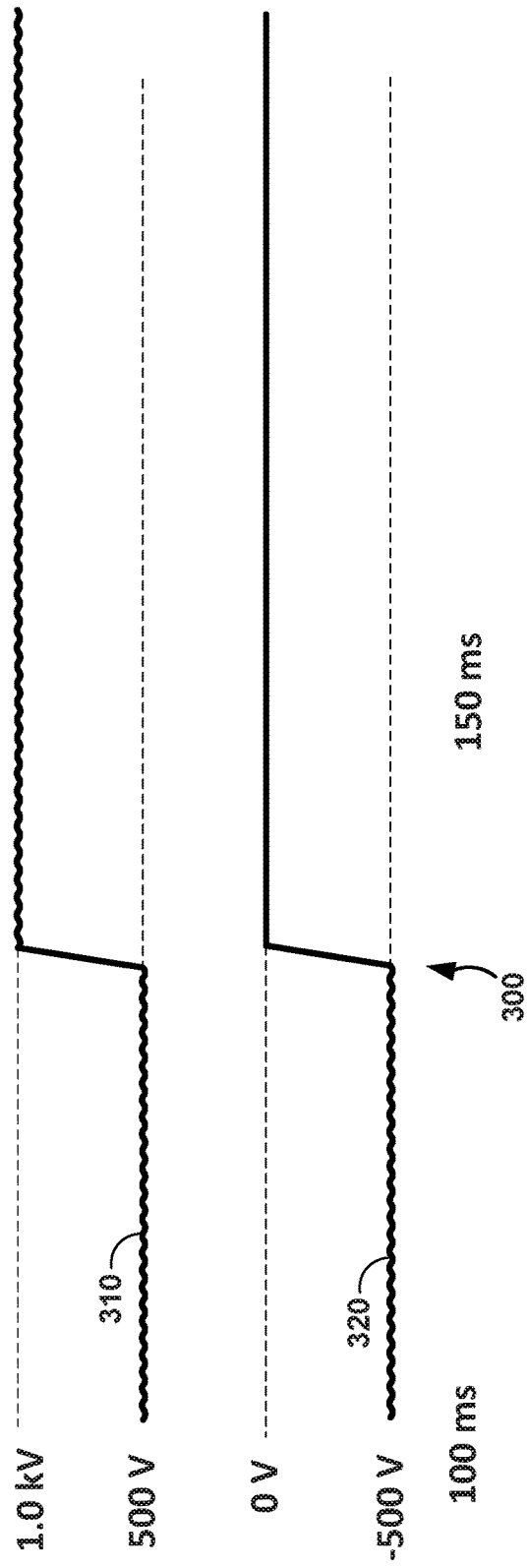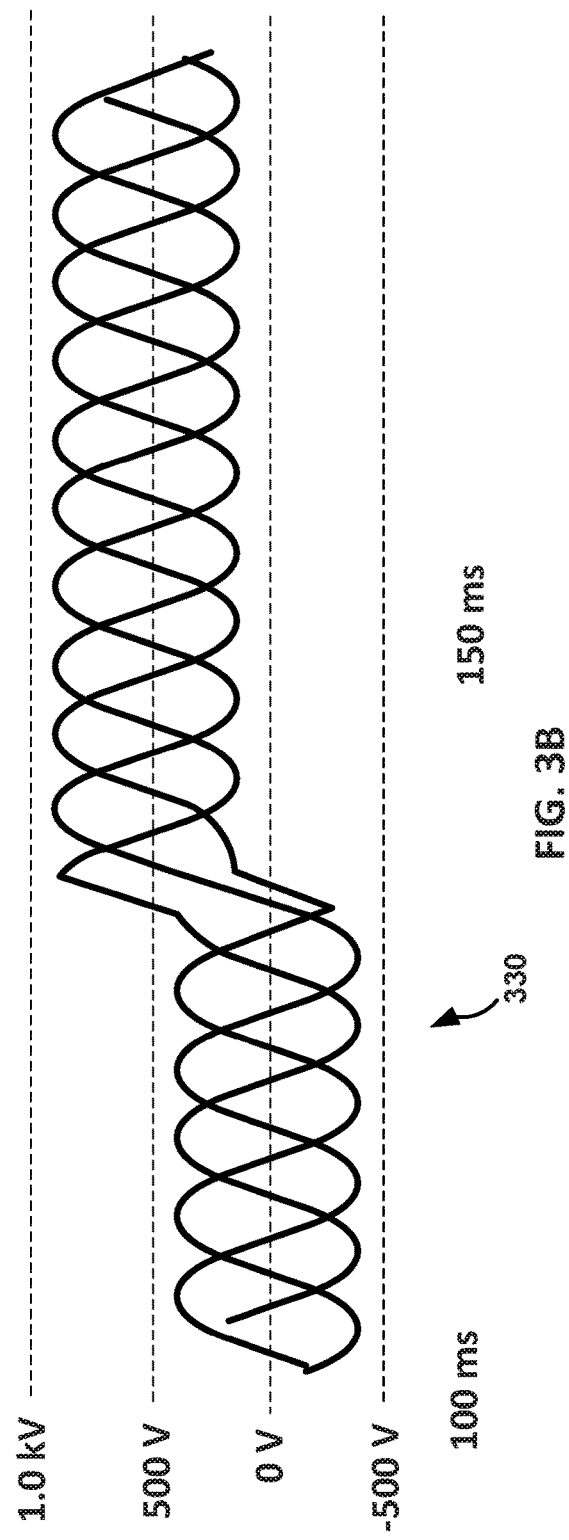

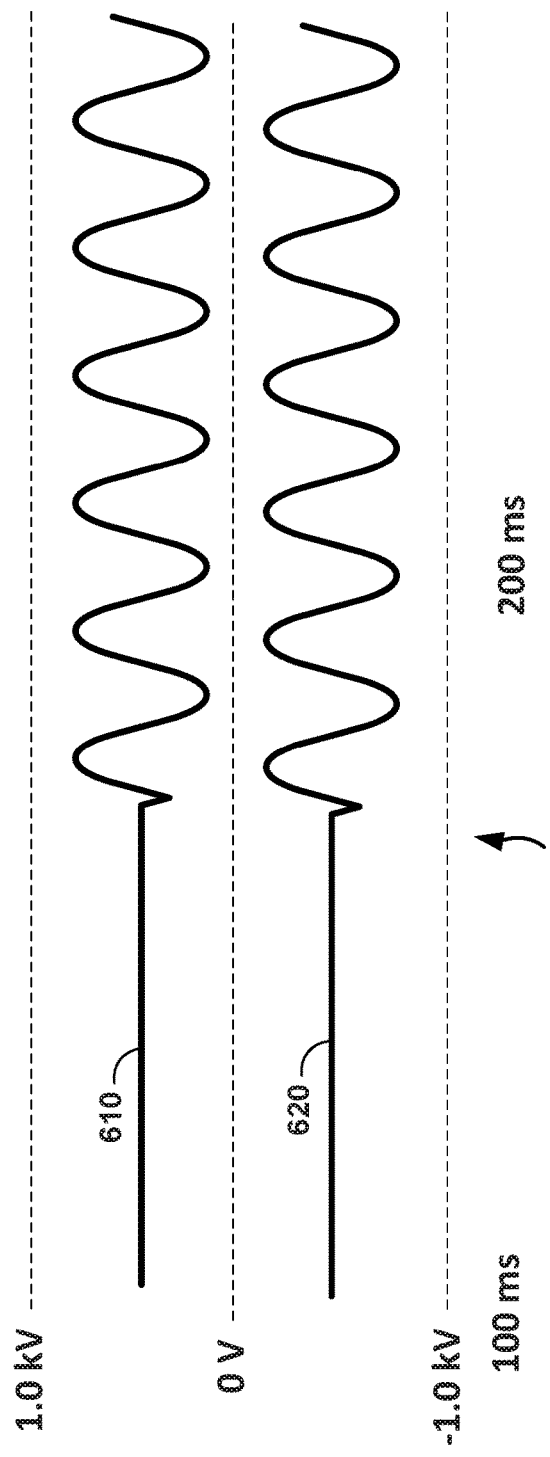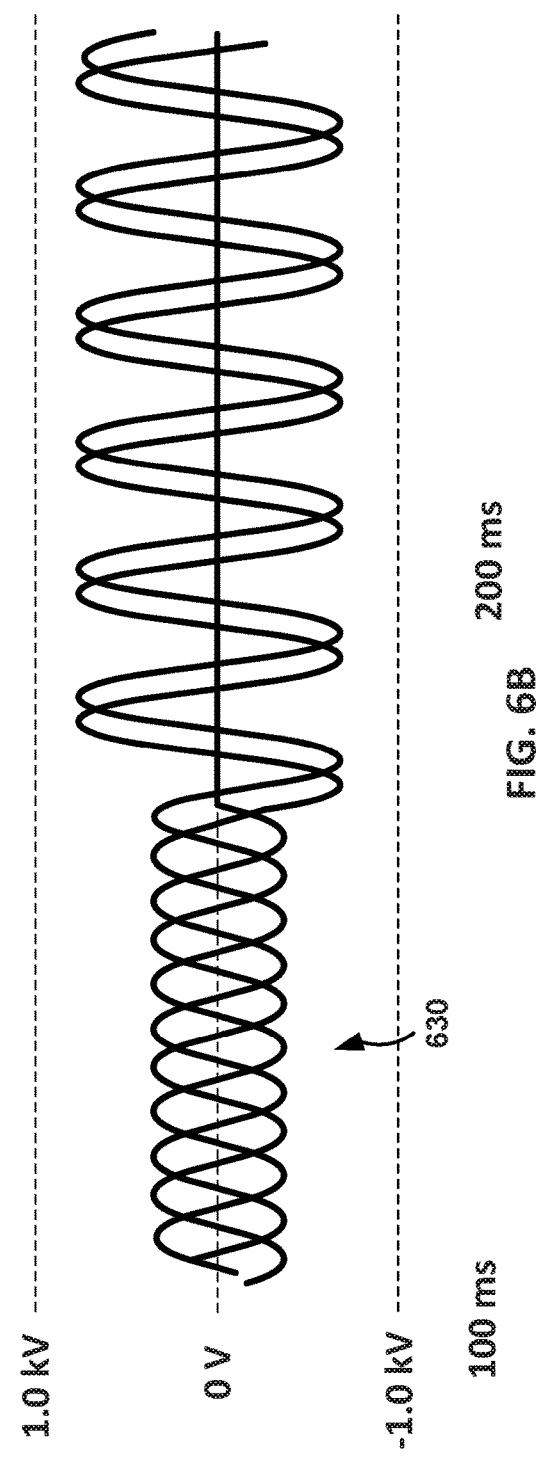

CONTROL OF AN ELECTRICAL POWER SYSTEM RESPONSIVE TO SENSING A GROUND FAULT

TECHNICAL FIELD

This disclosure relates to electrical power systems.

BACKGROUND

A distributed propulsion system may include an electric generator configured to generate alternating-current (AC) electricity based on the mechanical energy from a respective turbine engine. An AC/direct-current (DC) converter can convert the AC electricity into DC electricity for an electrical bus that distributes the DC electricity to a DC/AC inverter. The DC/AC inverter can supply an electrical load, such as a three-phase electric motor, with AC electricity.

A distributed propulsion system can experience a ground fault when an electrical line in the system becomes inadvertently connected to electrical ground. Electrical lines inside of a housing or case of a power component are typically insulated, but insulation can fail and an electrical line can come into contact with the housing or case, which may be grounded for safety purposes. For example, the insulation can fail by wearing down or degrading over time.

In a mixed AC/DC system, a ground fault can produce different effects depending on whether the ground fault occurs on the DC side or the AC side of the power converter. A ground fault on the DC side of an electrical power system can occur when one of the rails of a differential bus is shorted to a ground voltage level. A ground fault on the AC side of an electrical power system can occur when a wire on a multiphase line is shorted to a ground voltage level.

SUMMARY

This disclosure describes methods, systems, and techniques for controlling an electrical power system in response to determining a ground fault in the electrical power system, where the electrical power system may include a power converter, a differential bus, and/or an electric generator. This disclosure describes a controller configured to control the power converter based on a first target value. The controller can sense a ground fault in the electrical power system while controlling the power converter based on the first target value. Responsive to sensing the ground fault, the controller can control the power circuit based on a second target value different from the first target value.

In some examples, an electrical power system includes a differential bus, a power converter coupled to the differential bus, and a controller configured to control the power converter based on a first target value for the differential bus. The controller is also configured to sense that a ground fault has occurred in the electrical power system while controlling the power converter based on the first target value. The controller is further configured to, responsive to sensing that the ground fault has occurred, control the power converter based on a second target value for the differential bus, the second target value being different than the first target value.

In some examples, a method for controlling an electrical power system includes controlling, by a controller of the electrical power system, a power converter of the electrical power system based on a first target value for a differential bus of the electrical power system, the differential bus being coupled to the power converter. The method also includes sensing, by the controller, that a ground fault has occurred in the electrical power system while controlling the power converter based on the first target value. The method further includes responsive to sensing that the ground fault has occurred, controlling, by the controller, the power converter based on a second target value for the differential bus, the second target value being different than the first target value.

In some examples, a device includes a computer-readable medium having executable instructions stored thereon, configured to be executable by processing circuitry for causing the processing circuitry to control a power converter of the electrical power system based on a first target value for a differential bus of the electrical power system, the differential bus being coupled to the power converter. The instructions are further configured to cause the processing circuitry to sense that a ground fault has occurred in the electrical power system while controlling the power converter based on the first target value. The instructions are also configured to cause the processing circuitry to, responsive to sensing that the ground fault has occurred, control the power converter based on a second target value for the differential bus, the second target value being different than the first target value.

The details of one or more examples are set forth in the accompanying drawings and the description below. Other features, objects, and advantages will be apparent from the description and drawings, and from the claims.

BRIEF DESCRIPTION OF DRAWINGS

FIGS. 3A, 3B, and 4 show voltage and current graphs for a ground fault on a differential bus of an electrical power system.

FIGS. 6A, 6B, and 7 show voltage and current graphs for a ground fault on multiphase lines of an electrical power system.

DETAILED DESCRIPTION

Figure 1:
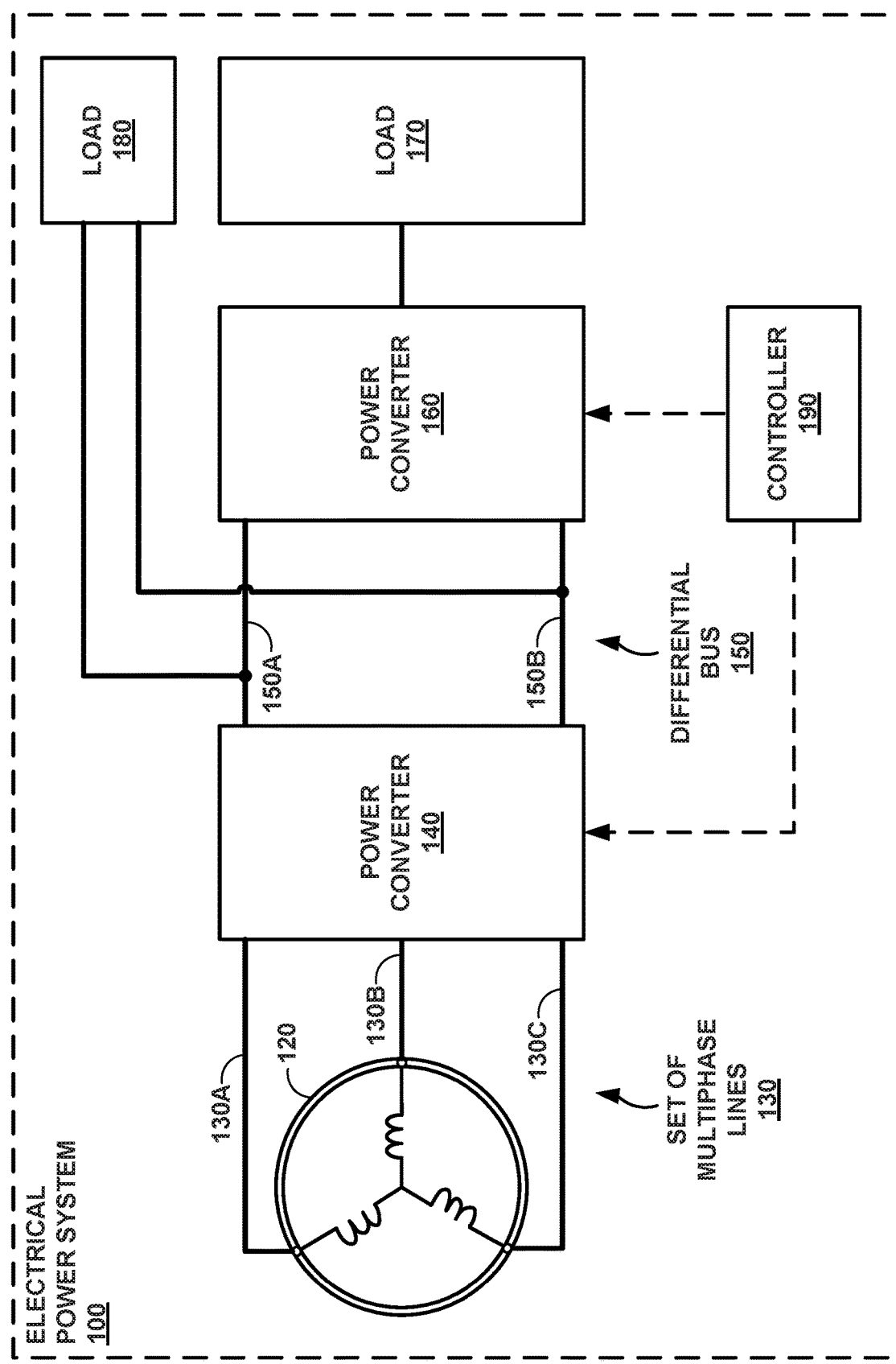
FIG. 1 is a conceptual block diagram illustrating an electrical power system including a controller, in accordance with one or more techniques of this disclosure.

This disclosure describes devices, methods, and techniques for controlling an electrical power system in case of ground faults on a differential bus. A controller may control a power converter of an electrical power system based on a first target value. Responsive to sensing a ground fault in the electrical power system, the controller may control the power converter based on a second target value that is different from the first target value.

A ground fault can occur on a differential bus. In examples in which a negative rail of the differential bus is shorted to ground, the voltage level of a positive rail of the differential bus may increase to a voltage level that is substantial higher than (e.g., two times higher) the positive rail before the ground fault. In addition, the voltage waveforms on a set of alternating-current (AC) multiphase lines may experience a direct-current (DC) offset that is one half of the nominal differential voltage across the differential bus. To mitigate the effects of the ground fault on the differential bus, a controller can reduce the differential voltage across the differential bus from a first target value to a second target value.

A ground fault can also occur on one of the AC multiphase lines of an electrical power system. In examples in which a multiphase line is shorted to ground, the voltage levels of rails on a differential bus may begin oscillating at a fundamental frequency of an electric motor or generator. The oscillations on the ungrounded multiphase lines may increase in voltage and/or current, and the phase differences across the ungrounded multiphase lines may change. To mitigate the effects of a ground fault on a multiphase line, a controller may reduce the voltage difference across the terminals of an electric generator to create a negative sequence electromotive force (EMF). Additionally or alternatively, the controller may switch from controlling a power converter based on a differential voltage across the differential bus to controlling the power converter based on a single-ended voltage on the differential bus.

A controller of this disclosure may perform fault accommodation techniques, using existing hardware in an electrical power system, such as mixed AC/DC systems, and in such a way that may extend the useful operational life and power capability of the electrical power system, in the event of a ground fault. In some electrical power systems, such as flight-safety critical platforms or military applications, continued operation during and after the occurrence of a ground fault can be desirable. As an example of a fault accommodation technique, described herein, an example controller can reduce thermal stress on machine rotors and filtering components of an electrical power system by reducing the voltages on a differential bus or across the terminals of an electric generator. Reducing the thermal stress on machine rotors may avoid demagnetization and component damage; and reducing the thermal stress on filtering components and other components within a power converter may extend the useful life of the power converter. The reduction of thermal stress may configure an electrical power system for continued operation during and after the occurrence of a ground fault because reducing the thermal stress may ensure lower voltages across the components in the electrical power system.

One option for mitigating the effects of a ground fault is to use more robust components to withstand the increased electrical and thermal stress caused by a ground fault. More robust components, however, can add weight and cost to the electrical power system. This disclosure describes techniques for controlling power converters to mitigate the effects of a ground fault, without requiring more robust components and without increasing the weight of an underlying electrical power system.

FIG. 1 is a conceptual block diagram illustrating an electrical power system 100 including a controller 190, in accordance with one or more techniques of this disclosure. Electrical power system 100 is configured to deliver electrical power to load 170 and/or load 180. In the example of FIG. 1, electrical power system 100 includes electric generator 120, set of multiphase lines 130, power converters 140 and 160, differential bus 150, and loads 170 and 180.

However, FIG. 1 shows just one example of electrical power system 100 and many other examples of electrical power system 100 may exist. For instance, in some examples, electrical power system 100 includes electric generator 120 and power converter 140 but does not include differential bus 150. In other examples, electrical power system 100 includes power converter 140 and differential bus 150 but does not include electric generator 120.

Electrical power system 100 may include a micro-grid, a mixed AC/DC system, an AC/AC system, a DC/DC system, an AC bus, a DC bus, and/or any other type of electrical system. Electrical power system 100 may also be part of a power generation system such as a power plant, a power distribution system, and/or a residential or commercial power system, which may include energy storage and electrical loads. Electrical power system 100 may be part of a vehicle such as any manned or unmanned: air vehicle, land vehicle, marine vehicle, space vehicle, and the like, which may include an engine, a generator, an alternator, and/or a power distribution system.

Electric generator 120 can convert mechanical power derived from a shaft, rotor, and/or other mechanical component to electrical power for use by other components or circuits of electrical power system 100. In some examples, electric generator 120 may also be mounted to a mechanical distribution system and/or a mechanical transmission system (for clarity in the drawings, neither of which is shown). In some examples, electrical power system 100 may include one or more additional electric generators, also not shown in FIG. 1. Electric generator 120 may be an AC generator such as an induction generator or a DC generator. Electric generator 120 may include a wound field machine, a Halbach array generator with permanent magnets on a rotor that is driven by an engine shaft or a propulsor shaft, or any other type of generator.

Set of multiphase lines 130 is coupled between electric generator 120 and power converter 140. In the example of FIG. 1, set of multiphase lines 130 are arranged as a three-phase set of electrical lines including lines 130A-130C, where each of lines 130A-130C is coupled to a different terminal of electric generator 120. In some examples, electrical power system 100 can include two or more sets of multiphase lines 130 coupled between electric generator 120 and power converter 140, where each set of multiphase lines may be electrically isolated from other sets of multiphase lines.

Power converters 140 and 160 each include components or circuitry convert one form of electrical power to another form of electrical power. Each of power converters 140 and 160 may include one or more switches arranged as a power conversion device, an analog electrical device, an embedded system, an integrated circuit (IC) device, a motor driver circuit, a multiphase converter, a two- or three-level converter, and/or any other power converter. In some examples, power converters 140 and 160 may include an alternating-current-to-direct-current (AC/DC) conversion device, a DC/DC conversion device, and/or any other conversion device. Power converters 140 and 160 may include a flyback conversion circuit, a buck conversion circuit, a boost conversion circuit, a buck-boost conversion circuit, a resonant-mode conversion circuit, a half-bridge circuit, an H-bridge circuit, and/or other conversion circuit.

Loads 170 and 180 receive and use electrical power from, respectively, power converter 160 or differential bus 150. Loads 170 and 180 may include an electric motor, a lighting device, a display system, a heating and cooling system, a rechargeable battery, a fuel pump, a hydraulic pump, a cabin load, and/or any other electrical load. Load 180 is configured to receive electrical power directly from differential bus 150 whereas load 170 is configured to receive electrical power indirectly from differential bus 150, via power converter

160. Power converter 160 may produce electrical power in a form that is usable by load 170. In examples in which load 170 includes a propulsor motor, power converter 160 may generate and deliver AC or DC electrical power with a voltage level, frequency, and number of phases to load 170.

Controller 190 can control the operation of power converter 140 and/or 160. Controller 190 may control one or more switches of power converters 140 and 160 by delivering control signals to the switches to turn-on or turn-off the switches. By controlling the switches of power converters 140 and 160, controller 190 may be able to control the voltage waveforms on each of rails 150A and 150B of differential bus 150 and each of multiphase lines 130A-130C. For example, by controlling the switches of power converters 140 and 160, controller 190 may control: the voltage levels on differential bus 150, the voltage levels on each of multiphase lines 130A-130C, and/or the voltage levels at one or more terminals of electric generator 120.

In some examples, controller 190 includes a single controller (e.g., a slack converter) configured to control both power converters 140 and 160. In other examples controller 190 includes multiple controllers (e.g., droop controllers), where a first controller can control power converter 140 and a second controller can control power converter 160. In examples in which controller 190 includes multiple droop controllers, one or more of the droop controllers may determine a new target value in response to sensing a ground fault and to communicate the new target value to the other droop controllers.

Controller 190 may include any suitable arrangement of hardware, software, firmware, or any combination thereof, to perform the techniques attributed to controller 190 herein. Examples of controller 190 include any one or more microprocessors, digital signal processors (DSPs), application specific integrated circuits (ASICs), full authority digital engine control (FADEC) units, engine control units (ECUs), field programmable gate arrays (FPGAs), or any other equivalent integrated or discrete logic circuitry, as well as any combinations of such components. When controller 190 includes software or firmware, controller 190 further includes any necessary hardware for storing and executing the software or firmware, such as one or more processors or processing units. In examples in which electrical power system 100 is mounted on a vehicle, controller 190 may be integrated with a FADEC unit.

In general, a processing unit may include one or more microprocessors, DSPs, ASICs, FPGAs, or any other equivalent integrated or discrete logic circuitry, as well as any combinations of such components. Although not shown in FIG. 1, controller 190 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to controller 190 (e.g., may be external to a package in which controller 190 is housed).

Although controller 190 is generally described as being the primary unit for controlling each of the components of electrical power system 100 for performing the techniques described herein, in some examples, the individual components of electrical power system 100 may include additional functionality for performing some or all of the operations described below with respect to controller 190. For example, a combination of one or more of electric generator 120, power converters 140 and 160, and loads 170 and 180 may include components for controlling the generation, transmission, and use of electricity in electrical power system 100.

In operation, controller 190 may control power converter 140 or 160 based on a first target value. For example, as an air vehicle electrical system, load 170 and/or load 180 may require power at a certain level and controlling power converter 140 and/or 160 may enable controller 190 to achieve that certain level. The first target value may be a default or steady-state condition for one or more voltage, current, or power levels on differential bus 150, set of multiphase lines 130, and/or the terminals of electric generator 120. Controller 190 may control the one or more switches of power converter 140 or 160 to achieve or approach the target value on differential bus 150, set of multiphase lines 130, and/or the terminals of electric generator 120.

At some point during operation, a ground fault may occur in electrical power system 100. Controller 190 may sense that a ground fault has occurred in electrical power system 100, while controlling power converter 140 or 160 based on the first target value. For example, controller 190 may receive or sense a signal from set of multiphase lines 130 and/or differential bus 150. The signal may indicate a voltage level and/or a current level on set of multiphase lines 130 and/or differential bus 150. Controller 190 may compare the sensed signal to a threshold, such as a ground voltage level or a common voltage level, to determine that the ground fault has occurred in electrical power system 100. For example, controller 190 may sense a ground fault by sensing that the voltage level on positive rail 150A of differential bus 150, negative rail 150B of differential bus 150, and/or one of set of multiphase lines 130 is approximately equal to the ground level. Controller 190 can determine that a voltage level is approximately equal to the ground level by determining that the voltage level is within a predetermined voltage of the ground level.

Responsive to sensing that the ground fault has occurred, controller may perform operations that try to minimize any resulting impact on loads 170 and 180 that may occur from the ground fault. Responsive to sensing that the ground fault has occurred, controller 190 may control power converter 140 or 160 based on a second target value for differential bus 150, the second target value being different than the first target value. To switch from controlling power converter 140 or 160 based on the first target value to the second target value, controller 190 may change the duty cycle and/or frequency of the control signals delivered to the one or more switches of power converter 140 or 160.

By switching from controlling power converter 140 or 160 based on the first target value to the second target value, controller 190 may be able to mitigate the effects of a ground fault. For example, responsive to sensing a ground fault, controller 190 may cause a differential voltage across differential bus 150 to decrease by controlling power converter 140 or 160. Reducing the differential voltage across differential bus 150 may reduce or prevent damage to components in electrical power system 100, such as resistors, capacitors, wire sheathing, component housing, semiconductor devices, and other components.

Additionally or alternatively, responsive to sensing a ground fault, controller 190 may cause a voltage level across the terminals of electric generator 120 to decrease by controlling power converter 140. Reducing the voltage level across the terminals of electric generator 120 may reduce the electrical losses induced on a rotor of electric generator 120, especially if the rotor in electric generator 120 is not laminated. Controller 190 may cause power converter 140 and set of multiphase lines 130 to inject negative sequence EMF to cancel magnetic fields that can induce eddy currents in electric generator 120.

Responsive to sensing a ground fault, controller 190 may switch from controlling power converter 140 or 160 based on a differential target value (e.g., the first target value) to controlling power converter 140 or 160 based on a single-ended target value (e.g., the second target value). Controller 190 can use a single-ended target value to regulate the voltage difference between rail 150A or 150B and a ground level. Using a single-ended target value, controller 190 may reduce the voltage level of rail 150A or 150B with respect to the ground level, as compared to using a differential target value.

Responsive to sensing the ground fault, controller 190 may also change a target current value and/or a target power value for electrical power system 100. In examples in which controller 190 can reduce the target value in response to sensing a ground fault, controller 190 can reduce a target power value to prevent an overcurrent condition.

The occurrence of a ground fault in electrical power system 100 can cause the voltages and/or currents in electrical power system 100 to exceed threshold levels, which may result in damage to the components of electrical power system 100. By controlling power converter 140 and/or 160 based on a second target value, controller 190 can reduce the likelihood that the voltages and currents will exceed threshold levels, thereby preventing damage to the components. Many of the components in electrical power system 100 cannot operate above threshold levels for more than a short period of time without sustaining damage due thermal or electrical stress. In addition, the occurrence of a ground fault can increase the eddy currents in electric generator 120. Controller 190 can generate negative sequence EMF to reduce the magnetic fields that can cause these eddy currents.

Figure 2:
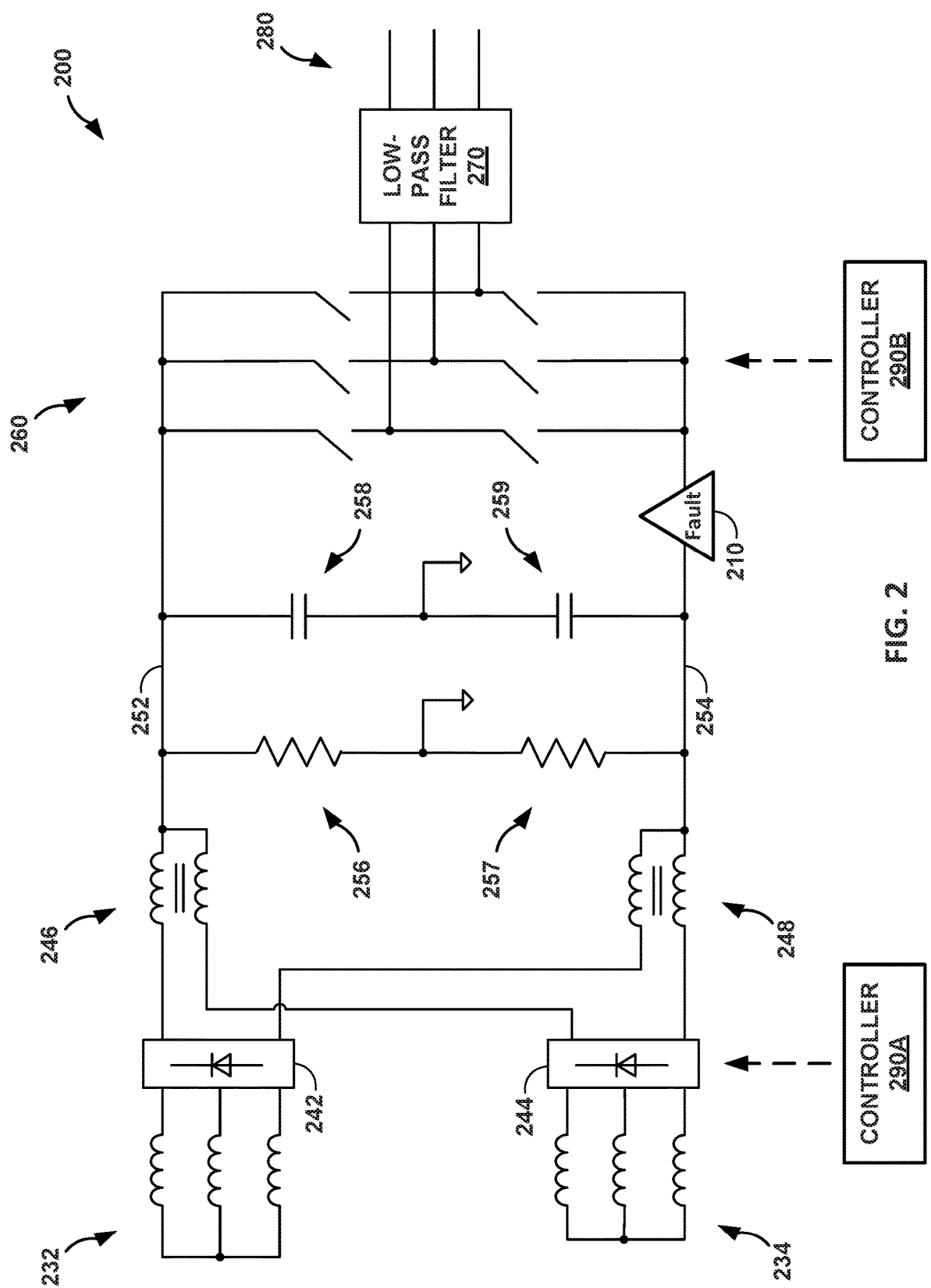
FIG. 2 is a schematic diagram showing a ground fault on a differential bus of an electrical power system, in accordance with one or more techniques of this disclosure.

FIG. 2 is a schematic diagram showing a ground fault 210 on a differential bus 250 of an electrical power system 200, in accordance with one or more techniques of this disclosure. In the example of FIG. 2, electrical power system 200 includes an electric generator with two sets of multiphase lines 232 and 234, rectifiers 242 and 244, transformers 246 and 248, differential rails 252 and 254, power converter 260, low-pass filter 270, multiphase lines 280, and controllers 290A and 290B. Electrical power system 200 can deliver electrical power generated by the coils on multiphase lines 232 and 234 to an electrical load coupled to multiphase lines 280.

Each of the sets of multiphase lines 232 and 234 may include three phases. Each phase includes an inductive coil that generates and delivers electrical current to rectifier 242 or 244. In the example of FIG. 2, set of multiphase lines 232 is electrically isolated from set of multiphase lines 234. Rectifiers 242 and 244 convert AC electricity to DC electricity. For example, rectifier 242 may convert the three-phase AC electricity to two rails of DC electricity. Rectifier 242 may deliver the positive rail of DC electricity to transformer 246 and deliver the negative rail of DC electricity to transformer 248.

Transformers 246 and 248 may combine the positive and negative DC electricity, respectively, and supply the combined power to rails 252 and 254 of a differential bus. Resistor 256 and capacitor 258 are connected between positive rail 252 and a reference ground node. Resistor 257 and capacitor 259 are connected between negative rail 254 and the reference ground node. Components 256-259 may have high impedance to balance the voltage levels on rails 252 and 254. In normal operation of electrical power system 200, very little current flows through components 256-259.

In the example of FIG. 2, power converter 260 converts the differential voltage received from rails 252 and 254 to multiphase AC electricity. Power converter 260 may include six switches arranged in three phases, where each phase includes a half-bridge circuit having a high-side switch and a low-side switch. Low-pass filter 270 may generate three smoothed AC signals based on the electrical signals received from power converter 260. Low-pass filter 270 can deliver the smoothed AC signals via multiphase lines 280 to an electrical load such as a three-phase electrical motor.

FIG. 2 depicts ground fault 210 occurring on negative rail 254. Ground fault 210 can occur because of a short circuit to the reference ground node due to a failure of electrical insulation on negative rail 254. In normal operation, the voltage levels of rails 252 and 254 may be plus/minus 270 volts with respect to the ground level, plus/minus 500 volts with respect to the ground level, or any other voltage level suitable for a specific application. Ground fault 210 may cause the voltage level of negative rail 254 to increase to the voltage level of the reference ground level. Ground fault 210 may also cause positive rail 252 to increase to twice the nominal voltage level (e.g., from 270 volts to 540 volts).

Ground fault 210 can cause the voltage level of positive rail 252 to double. Ground fault 210 can also cause the AC voltage waveforms on multiphase lines 232, 234, and 280 to shift to a DC offset of one-half of the nominal bus voltage. Ground fault 210 may cause increased voltage stress on winding-to-case insulation (e.g., slot liners), Y-capacitors 258 and/or 259, and centering resistors 256 and/or 257, and any other components connected between rails 252 and 254 and the reference ground node (e.g., common mode filter components). Ground fault 210 can cause increased leakage current through one of resistors 256 and 257 and increased ripple current through one of Y-capacitors 258 and 259.

Electrical power system 200 may include controllers 290A and 290B configured to control power converter 260 and/or rectifiers 242 and 244. Controllers 290A and 290B may monitor and control a differential voltage across rails 252 and 254. The differential voltage across rails 252 and 254 is the difference between the voltage level on rail 252 and the voltage level on rail 254. Controller 290A can control the differential voltage across rails 252 and 254 to a differential target value by turning on and off the switches of switching rectifiers 242 and 244. Controller 290B can control the differential voltage across rails 252 and 254 to the differential target value by turning on and off the switches of power converter 260.

Controllers 290A and 290B may sense ground fault 210, for example, in response to determining that a voltage level of negative rail 254 is approximately equal to a ground level. Controllers 290A and 290B may determine that the voltage level of rail 254 is approximately equal to the ground level by determining that the voltage level of rail 254 is within one, five, ten, or twenty volts of the ground level. In some examples, controllers 290A and 290B can use a debouncing technique to check a voltage level after a particular time duration to avoid determining that a ground fault has occurred based on a voltage spike or dip that lasts a very short amount of time. Additionally or alternatively, controllers 290A and 290B can deploy any other suitable ground fault detection mechanism to sense ground fault 210. Responsive to sensing ground fault 210, controllers 290A and 290B may change the target value for the differential voltage across rails 252 and 254. In some examples, responsive to sensing ground fault 210, controllers 290A and 290B control the differential voltage across rails 252 and 254 to a second target value that is less than the first target value used by controllers 290A and 290B before sensing ground fault 210. For example, controllers 290A and 290B may set the new target value equal to half of the previous target value (e.g., half of the nominal differential voltage target value). In other examples, the new target value may be greater than half the nominal target value if the components within the power converter can withstand a higher voltage stress.

While monitoring the difference between the voltage level on rail 252 and the voltage level on rail 254, controllers 290A and 290B may not detect the occurrence of ground fault 210. Although the voltage levels on rails 252 and 254 change due to ground fault 210, the difference between the voltage levels on rails 252 and 254 may remain nearly constant at, for example, 540 or 1,000 volts. Thus, controllers 290A and 290B may monitor the differential voltage across rails 252 and 254 (e.g., the voltage difference between rails 252 and 254) and the single-ended voltage levels of rails 252 and 254 (e.g., the voltage levels of rails 252 and 254 with respect to a ground level).

In some examples, electrical power system 200 may include a single controller configured to perform the functions attributed herein to controllers 290A and 290B. The single controller may control all of the power converters that are coupled to rails 252 and 254 (e.g., power converter 260 and rectifiers 242 and 244). The single controller, known as a slack controller, may not communicate the second target value to any other controllers. In other examples, electrical power system 200 may include two or more controllers configured to control the power converters coupled to rails 252 and 254. The master controller may sense ground fault 210 and communicate an alert signal to the other controllers in response to sensing that ground fault 210 has occurred. The master controller may also communicate the second target value to the other controllers so that all of the controllers are using the same setpoint for controlling the power converters.

In examples in which controllers 290A and 290B reduce the differential voltage across rails 252 and 254, controllers 290A and 290B may use field-weakening techniques to maintain control of the electric generator or motor. Controllers 290A and 290B can use field-weakening to diminish the terminal voltage of the electric generator or motor. In some examples, control of the electric generator or motor is more effective when the differential voltage across rails 252 and 254 is substantially larger than the internal voltage of the electric generator or motor (i.e., the back EMF). Controllers 290A and 290B can use field weakening to reduce the terminal voltage of the electric generator or motor to be less than the differential voltage across rails 252 and 254. Field-weakening techniques may allow controllers 290A and 290B to control a generator or motor when the DC voltage on rails 252 and 254 decreases due to a ground fault.

Controller 290B may control a terminal voltage of the electric generator or motor (e.g., a voltage difference between two or more of the coils of multiphase lines 280) based on a target value. Controller 290B may control the terminal voltage by controlling the switches of power converter 260. Responsive to sensing ground fault 210, controller 290B may control the terminal voltage of the electric generator or motor based on a new target value that is different than the target value before sensing ground fault 210. Controller 290B may also determine whether the differential voltage across rails 252 and 254 exceeds the terminal voltage of the electric generator or motor by at least a threshold voltage level, such as ten, twenty, fifty, or one hundred volts. Responsive to determining that the differential voltage across rails 252 and 254 exceeds the terminal voltage by less than the threshold voltage level, controller 290B may control the terminal voltage of the electric generator or motor to a further target value that is different than the previous target value(s).

Figure 4:
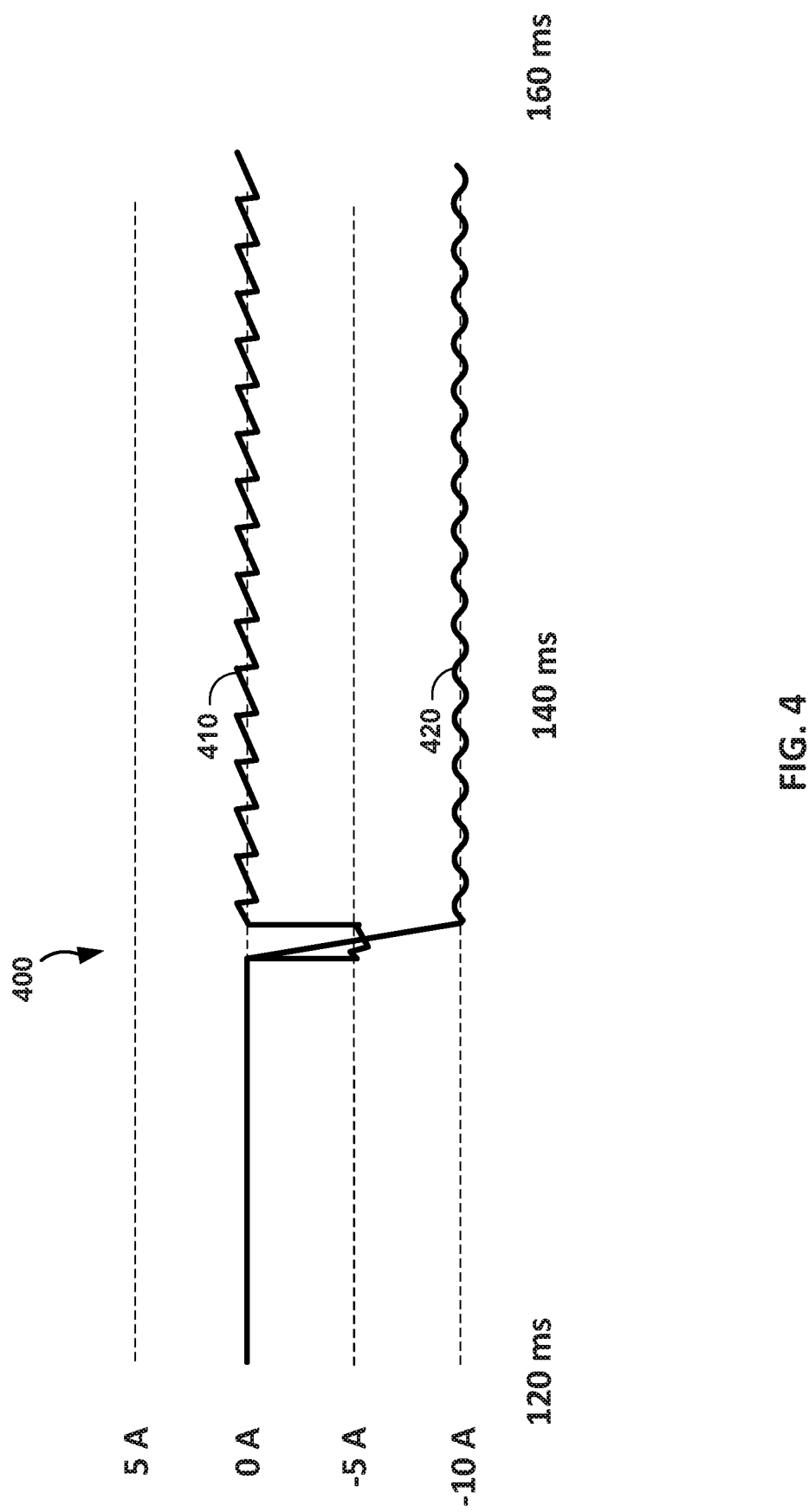

FIGS. 3A, 3B, and 4 show voltage and current graphs for a ground fault on a differential bus of an electrical power system. FIGS. 3A, 3B, and 4 show the effect of a ground fault occurring at times 300 and 400 on a negative rail of a differential bus. Voltage levels 310 and 320 represent the voltage levels on a positive and negative rail, respectively. FIGS. 3 and 4 show an example with plus/minus five hundred volts, but the it should be understood that the concepts discussed herein can apply to a differential bus with any other voltage level. Before the occurrence of the ground fault, voltage level 310 is approximately positive five hundred volts with respect to a ground level, and voltage level 320 is approximately negative five hundred volts with respect to the ground level. After the occurrence of the ground fault, voltage level 310 is approximately positive one thousand volts with respect to the ground level, and voltage level 320 is approximately equal to the ground level.

Voltage waveforms 330 represent the voltage levels on three multiphase lines. Before the occurrence of the ground fault, voltage waveforms 330 oscillate about a ground level. After the occurrence of the ground fault, voltage waveforms 330 oscillate about positive five hundred volts above a ground level.

Current level 410 represents the electrical current through a capacitor (e.g., capacitor 258 shown in FIG. 2) coupled between a positive rail and a reference ground node. Current level 420 represents the differential mode electrical current through the centering resistors (e.g., resistors 256 and 257 shown in FIG. 2) coupled between the positive rail and a reference ground node. Before the occurrence of the ground fault at time 400, current levels 410 and 420 are approximately equal to zero. After the occurrence of the ground fault, current level 410 drops to negative five amperes for approximately one millisecond due to the change in voltage at time 400 before returning to zero. After the occurrence of the ground fault, current level 420 drops to negative ten amperes because of the increased steady-state voltage difference between the positive rail and the ground level.

A controller may sense the ground fault at times 300 and 400 by monitoring the voltage difference between a positive rail and a ground level and by monitoring the voltage difference between a negative rail and the ground level. Responsive to sensing that the ground fault has occurred, the controller may control a power converter based on a new target value. In some examples, the new target value is a differential voltage level that is one half of the previous target value for normal operating conditions. By reducing the target value for the differential voltage across the rails of differential bus, the controller can cause voltage level 310 to return from one thousand volts to five hundred volts, which can reduce the likelihood of damage to the components of the electrical power system. By reducing the target value in response to sensing a ground fault, the controller may also reduce the DC offset of voltage waveforms 330 after time 300 from five hundred volts to a DC offset of two hundred and fifty volts. The controller may also reduce current level 410 after time 400 from negative ten amperes to negative five amperes.

The controller may control a power converter based on a power limit for a differential bus coupled to the power converter. In examples in which the ground fault occurs and the controller reduces the target value, the electrical current may increase in the differential bus in order to achieve substantially the same power as before the ground fault occurred. The controller may set a new power limit in response to sensing the ground fault to maintain the current and power in the system below threshold levels.

Figure 5:
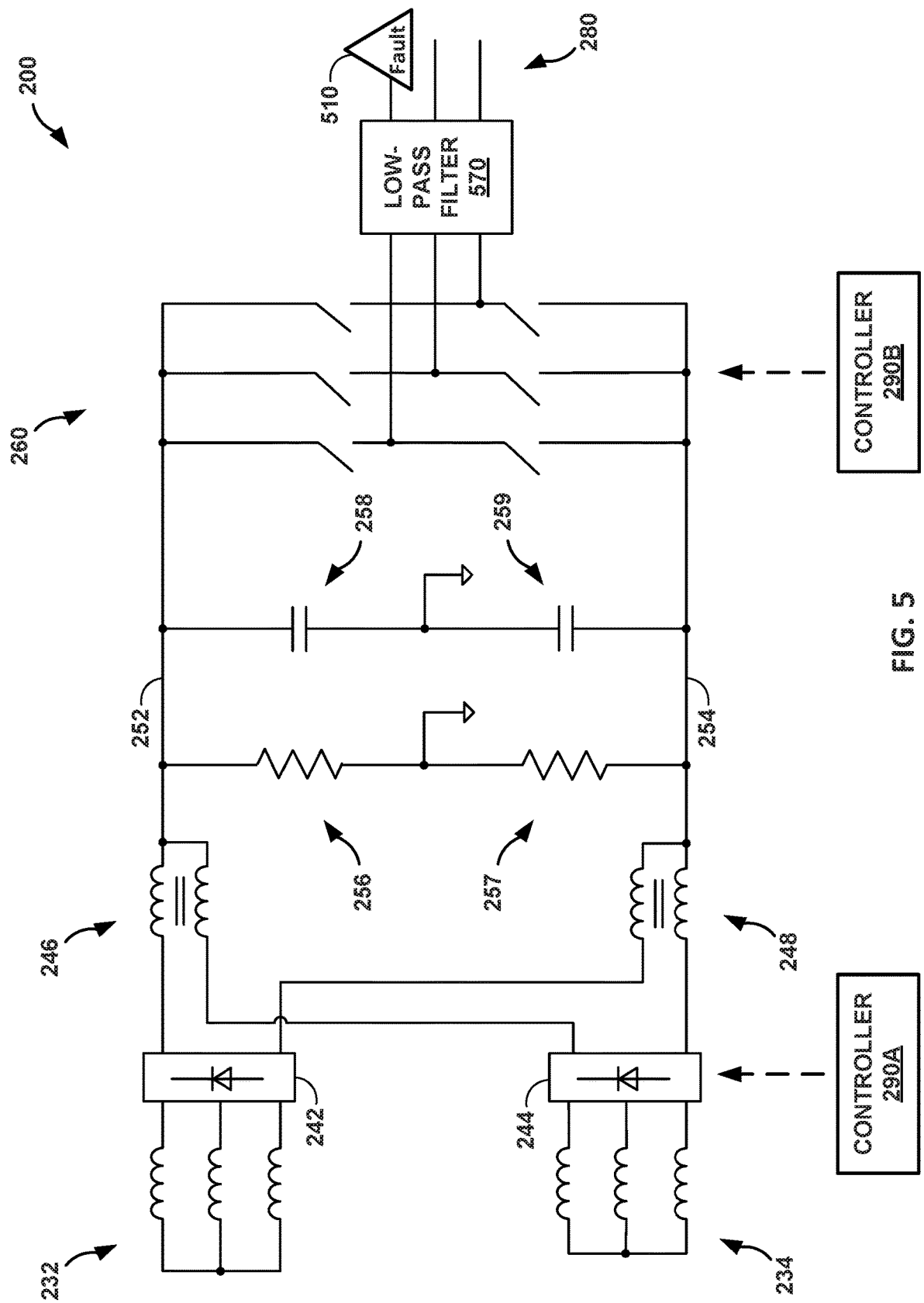
FIG. 5 is a schematic diagram a ground fault on multiphase lines of an electrical power system, in accordance with one or more techniques of this disclosure.

FIG. 5 is a schematic diagram a ground fault 510 on multiphase lines 280 of electrical power system 200, in accordance with one or more techniques of this disclosure. The reference numerals in FIG. 5 are the same as the reference numerals in FIG. 2 because the structure of electrical power system 200 is the same in both FIG. 2 and FIG. 5. However, the effects of ground fault 510 on electrical power system 200 may differ from the effects of ground fault 210 on electrical power system 200. Moreover, the control techniques for addressing the effects of ground fault 510 may differ from the control techniques for addressing the effects of ground fault 210.

Controller 290B may sense ground fault 510 by determining that a voltage level of one of multiphase lines 280 is approximately equal to a ground level. Controller 290B can determine that the voltage level of one of multiphase lines 280 is approximately equal to the ground level by determining that the voltage level of the one of multiphase lines 280 is within one, five, ten, or twenty volts of the ground level. Responsive to sensing ground fault 510, controller 290B can change a target value for the terminal voltage of an electric generator coupled to multiphase lines 280.

During operation of the power system during ground fault 510, the rotor of the electric generator or motor may experience a negative sequence EMF due to the terminal voltage on multiphase lines 280. Controller 290B can use field-weakening control to reduce the terminal voltage by creating an EMF opposing the magnet flux that travels in the positive sequence (i.e., the same direction as the rotor rotation). Controller 290B can use a very similar control technique to create a negative sequence EMF to cancel oscillating magnetic fields seen by the rotor, which can induce eddy currents.

Oscillating magnetic fields in the rotor of a generator or motor can heat and possibly demagnetize the rotor in the case of a permanent magnet rotor. An oscillating field can cause an eddy current, which is an unintended electrical current flowing through the generator or motor. In some examples, the stator may include steel, which is partially conductive. Oscillating fields in near the steel can induce currents within the steel and cause the temperature of the steel to increase. The eddy currents may increase the electrical losses in electrical power system 200. The rotor may include permanent magnetic material, which may become demagnetized due to eddy currents.

In some examples, an electric generator may have two or more sets of multiphase lines (e.g., multiphase lines 280) that are electrically isolated. For example, multiphase lines 280 may include redundant buses fed by electrically isolated winding sets on the same electric generator. In examples in which controller 290B senses that ground fault 510 has occurred on a first set of multiphase lines, controller 290B can control the voltage level on a second set of multiphase lines by controlling a power converter coupled to the second set of multiphase lines. Thus, controller 290B can control the power converter coupled to the healthy (e.g., ungrounded) set of multiphase lines to inject the negative sequence EMF. Controller 290B may control the voltage level on the second set of multiphase lines to inject negative sequence EMF into electric generator.

In some examples, controller 290B controls power converter 260 based on a target value for a differential voltage across rails 252 and 254. Responsive to sensing ground fault 510, controller 290B can switch to controlling power converter 260 based on a target value for a single-ended voltage on rail 252 or 254. For example, responsive to sensing ground fault 510, controller 290B may switch from controlling power converter 260 based on a 1000-volt differential voltage target for rails 252 and 254 to controlling power converter 260 based on 500-volt single-ended voltage target for rail 252 or 254.

In some examples, power converter 260 includes a three-level power converter coupled to positive rail 252, negative rail 254, and a ground rail. Positive rail 252 may operate as a high level, the ground rail may operate as a middle level, and negative rail 254 may operate as a low level. To control power converter 260 based on a differential voltage target, controller 290B can monitor the differential voltage across rails 252 and 254 and control the switches of power converter 260 to achieve the differential voltage target. To control power converter 260 based on a single-ended voltage target, controller 290B can monitor a voltage difference between rail 252 and the ground level (e.g., a ground rail) or between rail 254 and the ground level and control the switches of power converter 260 to achieve the single-ended voltage target. In some examples, controller 290B controls power converter 260 to achieve a first single-ended voltage target for the voltage difference between rail 252 and the ground level and to achieve a second single-ended voltage target for the voltage difference between rail 254 and the ground level, where the first and second single-ended target values may be the same.

For example, controller 290B can control power converter 260 based on a differential target value of one thousand volts for rails 252 and 254, which may be known as line-line control. Responsive to sensing ground fault 510, controller 290B may switch to controlling power converter 260 based on a single-ended target value of five hundred volts for the voltage difference between rail 252 and the ground level or the voltage difference between rail 254 and the ground level. Using a single-ended target value may be known as line-ground control. Thus, in response to sensing ground fault 510, controller 290B may switch from line-line control to line-ground control.

As shown in FIGS. 6A and 6B, the differential voltage across rails 252 and 254 may remain nearly constant after ground fault 510 occurs, despite the oscillations in the voltage levels on rails 252 and 254. By controlling power converter 260 based on a single-ended target value, controller 290B can reduce the maximum amplitudes of the voltage levels on rails 252 and 254, which may increase after ground fault 510 occurs.

Figure 7:
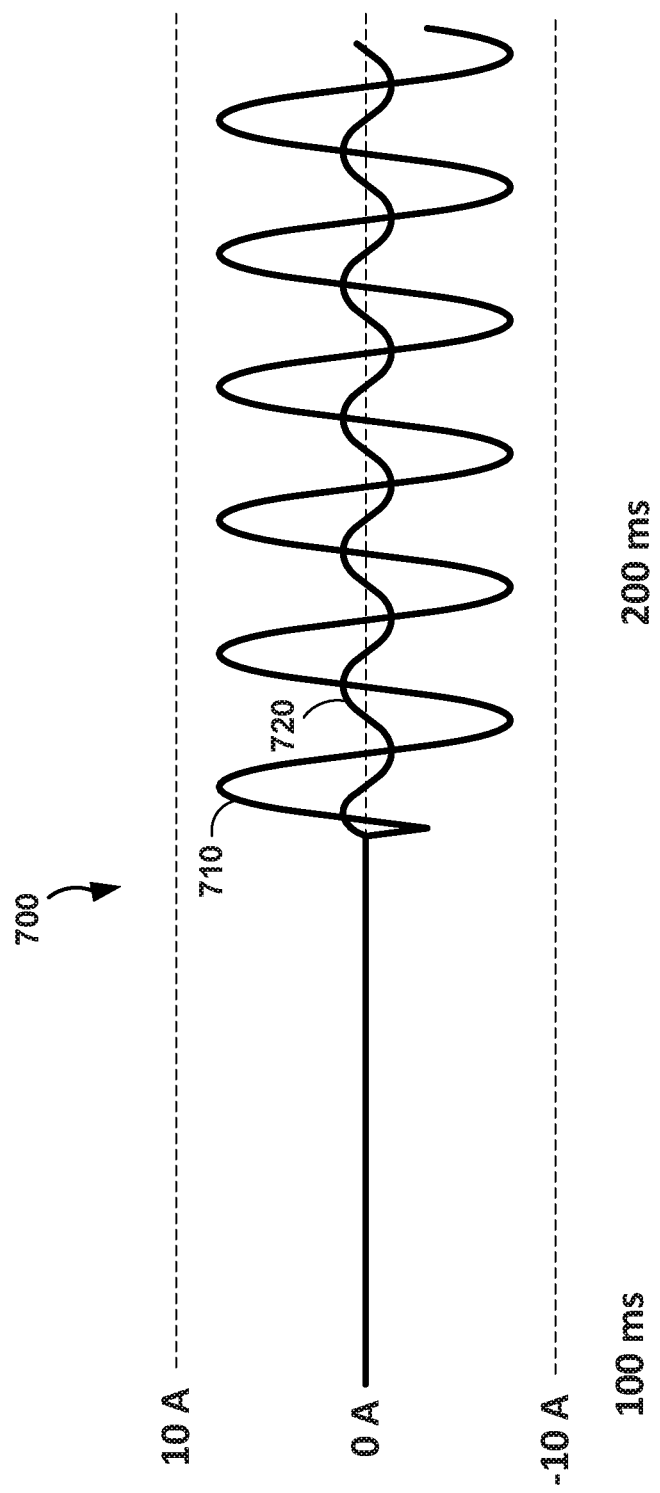

FIGS. 6A, 6B, and 7 show voltage and current graphs for a ground fault on multiphase lines of an electrical power system. FIGS. 6A, 6B, and 7 show the effect of a ground fault occurring at times 600 and 700 on a multiphase line. Voltage levels 610 and 620 represent the voltage levels on a positive and negative rail, respectively. FIGS. 6A, 6B, and 7 show an example with plus/minus five hundred volts, but the it should be understood that the concepts discussed herein can apply to a differential bus with any other voltage level. Before the occurrence of the ground fault, voltage level 610 has a DC value of approximately positive five hundred volts with respect to a ground level, and voltage level 620 has a DC value of approximately negative five hundred volts with respect to the ground level. After the occurrence of the ground fault, voltage levels 610 and 620 oscillate around the nominal values of positive and negative five hundred volts, respectively, at a fundamental frequency of an electric generator or an electrical motor.

By switching from controlling based on a differential target value to controlling based on a single-ended target value, a controller can reduce the swings in voltage levels 610 and 620. Instead of a maximum amplitude of eight hundred volts with respect to the ground level as shown in FIGS. 6A and 6B, voltage level 610 may have a maximum amplitude of five hundred volts if the controller uses a single-ended target value.

Voltage waveforms 630 represent the voltage levels on three multiphase lines. Before the occurrence of the ground fault, voltage waveforms 630 oscillate about a ground level with equal phase offsets and an amplitude of three hundred volts. After the occurrence of the ground fault, voltage waveforms 630 oscillate about the ground level with different phase offsets and an amplitude of six hundred volts (twice the nominal level). Voltage waveforms 630 may be unbalanced with respect to the ground level. Negative-sequence or zero-sequence components may now exist in voltage waveforms 630. The rotor in an electrical machine may normally see a nearly constant magnetic field, but the occurrence of a ground fault at time causes oscillations in the magnetic field.

Current level 710 shown in FIG. 7 represents the differential mode electrical current through a resistors (e.g., resistors 256 and 257 shown in FIG. 5) coupled between the positive rail and a reference ground node. Current level 720 represents the electrical current through a capacitor (e.g., capacitor 258 shown in FIG. 5) coupled between a positive rail and a reference ground node. Before the occurrence of the ground fault at time 700, current levels 710 and 720 are approximately equal to zero. After the occurrence of the ground fault, current levels 710 and 720 oscillate at the fundamental frequency and have amplitudes of seven and one amperes, respectively.

A ground fault on the multiphase lines can induce high ripple currents 710 and 720 at the fundamental frequency on the Y-capacitors (e.g., capacitors 258 and 259) and the centering resistors (e.g., resistors 256 and 257). When a ground fault occurs on the multiphase lines, the rotor of an electric generator or an electrical motor may see oscillating EMF at the fundamental frequency, and/or twice the fundamental frequency. In contrast, during normal operation, the rotor sees a steady value magnetic field, with the exception of small ripple components caused by converter switching action, or the the non-uniform field caused by stator slot openings. The oscillating EMF may induce high eddy-current losses on the rotor, especially in examples in which the rotor is non-laminated, or contains non-segmented permanent magnets.

Figure 8:
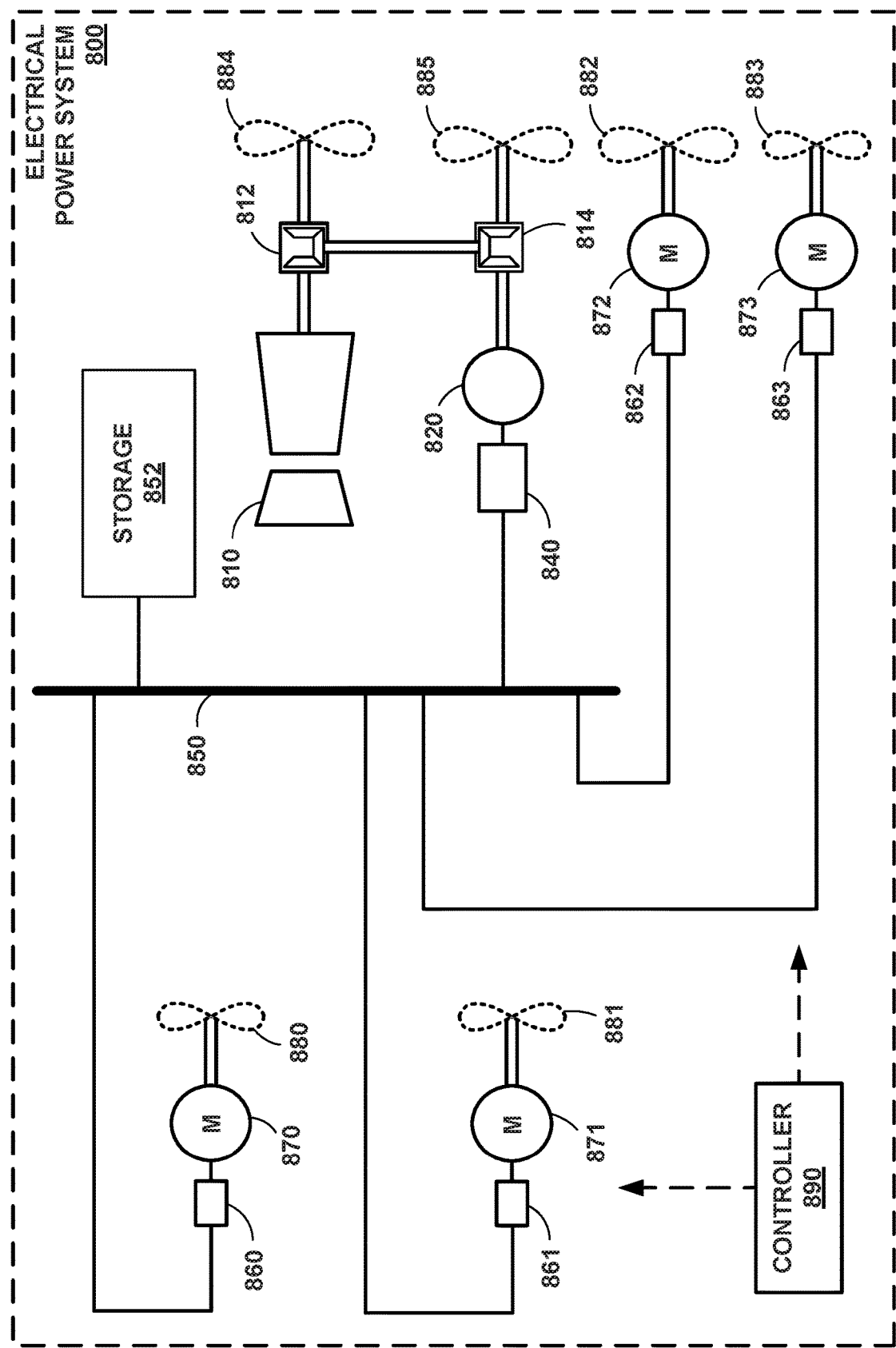
FIG. 8 is a conceptual block diagram illustrating a distributed propulsion system including a turbine engine, in accordance with one or more techniques of this disclosure.

FIG. 8 is a conceptual block diagram illustrating a distributed propulsion system 800 including a turbine engine 820, in accordance with one or more techniques of this disclosure. Controller 890 includes one or more controllers that can control power converters 840 and 860-863 based on a target value for differential bus 850 and/or a target value for the terminal voltage of electric generator 820 and/or electric motors 870-873.

Power converters 860-863 receive electricity from electrical bus 850 and convert the electricity to another form of electricity, such as one-phase AC electricity or three-phase AC electricity. Propulsor motors 870-873 drive propulsor fans 880-883 based on the other form of electricity delivered by power conversion circuitry 860-863. Thus, turbine engine 820 drives engine fan 884, mechanically driven propulsor 885, and electrically driven propulsors 880-883.

Energy storage unit 852 receives and stores electricity from differential bus 850. Controller 890 may control the storage and release of electricity from energy storage unit 852. In some examples, controller 890 may cause energy storage unit 852 to release electricity to electrical bus 850 and cause generator 820 to receive the electricity from electrical bus 850. Generator 820 may operate as an electric motor and reverse-drive propulsor fan 885.

Controller 890 may release electricity from energy storage unit 852 to provide additional power to system 800. For example, during acceleration of a vehicle, the controller may cause energy storage unit 852 to release electricity to increase the propulsion generated by system 800. The controller may also cause energy storage unit 852 to release electricity to electrical loads in system 800 such as a fuel pump, a hydraulic pump, a cabin load, an interior lighting and display system, a heating and cooling system, and/or any other electrical load.

Controller 890 may be configured to perform the techniques described herein with respect to controllers 190, 290, and 590. For example, controller 890 can control one or more of power converters 840 and 860-863 based on a first target value. The first target value may be a different voltage target for differential bus 850, a single-ended voltage target for differential bus 850, and/or a target value for the terminal voltage of one or more of electric generator 820 and electric motors 870-873.

While controlling one or more of power converters 840 and 860-863 based on the first target value, controller 890 may sense a ground fault in electrical power system 800, such as a ground fault on differential bus 850 or in a line between one of power converters 840 and 860-863 and a respective one of electric generator 820 and electric motors 870-873.

Responsive to sensing the ground fault, controller 890 may control one or more of power converters 840 and 860-863 based on a second target value that is different than the first target value. In some examples, controller 890 may change target value for the differential voltage, single-ended voltage, and/or terminal voltage. Additionally or alternatively, controller 890 may switch from controlling based on a first parameter (e.g., differential voltage, single-ended voltage, and/or terminal voltage) to controlling based on a second parameter. In examples in which controller 890 controls one of power converters 840 and 860-863 based on a target value for a terminal voltage of a respective one of electric generator 820 and electric motors 870-873, controller 890 can cause the power converter to inject negative sequence EMF to the respective electric generator or electric motor.

Figure 9:
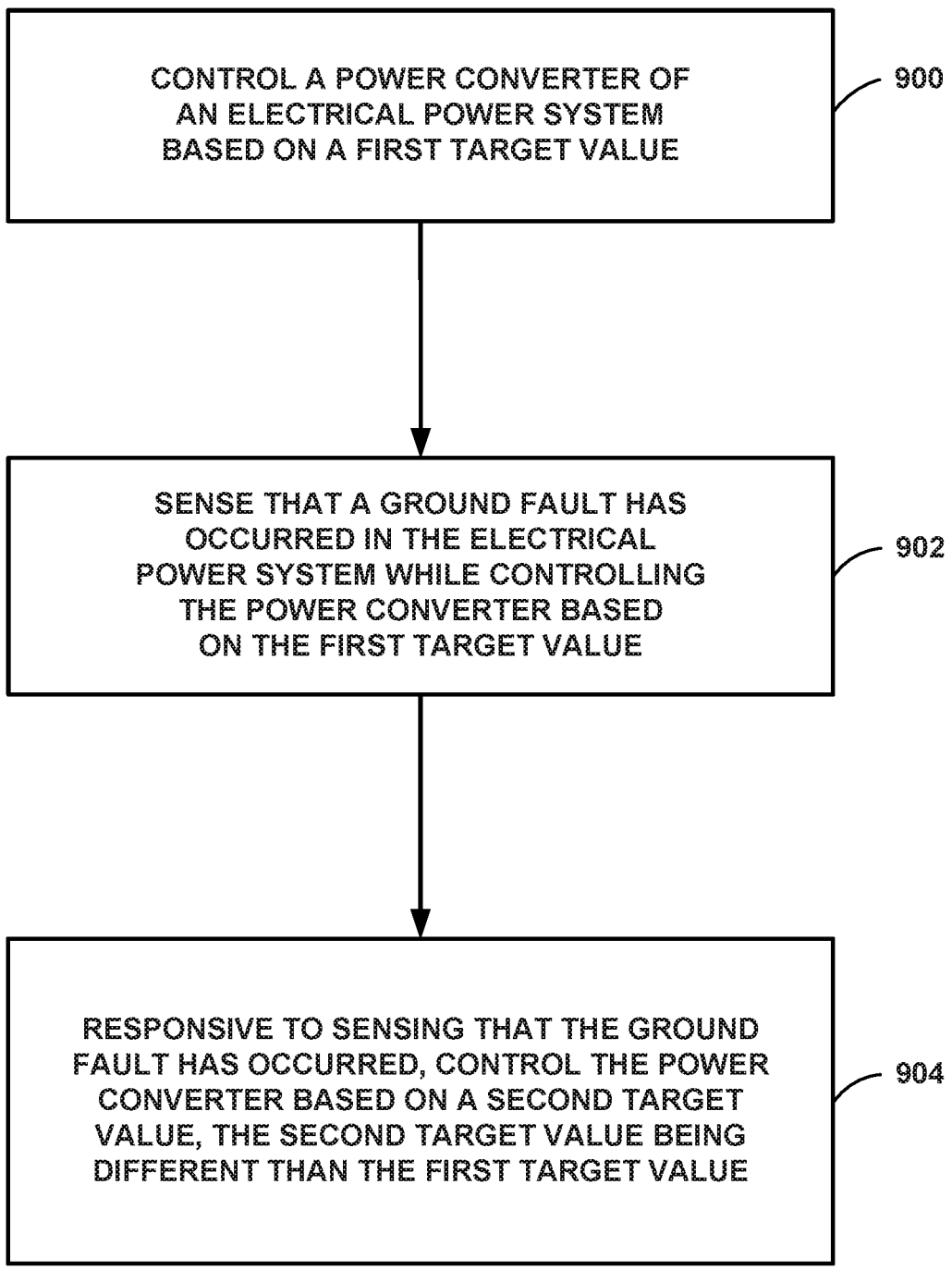
FIG. 9 is a flowchart illustrating an example process for controlling an electrical power system, in accordance with one or more techniques of this disclosure.

FIG. 9 is a flowchart illustrating example processes for controlling an electrical power system, in accordance with some examples of this disclosure. The techniques of FIG. 9 is described with reference to controller 190 shown in FIG. 1, although other components may exemplify similar techniques. FIG. 9 includes operations 900 through 904. Operations 900 through 904 may be performed in a different order than what is shown in FIG. 9. Additional operations, beyond operations 900 through 904, may be performed in other examples. Controller 190 may be configured to perform any of operations 900 through 904, or any and all other techniques described with respect to FIG. 9.

In the example of FIG. 9, controller 190 controls power converter 140 or 160 based on a first target value (900). Controller 190 can control power converter 140 or 160 by delivering control signals to the switches of power converter 140 or 160 to turn on and turn off the switches. The voltage levels on differential bus 150 and the terminal voltage on electric generator 120 may be based on the control signals delivered to power converters 140 and 160 by controller 190.

In the example of FIG. 9, controller 190 senses a ground fault has occurred in electrical power system 100 while controlling power converter 140 or 160 based on the first target value (902). Controller 190 can sense the ground fault based on determining that the voltage level of rail 150A or 150B of differential bus 150 or the voltage level of one of lines 130A-130C of multiphase lines 130 is approximately equal to a ground voltage level. Controller 190 can include a node to receive a signal from a current-sense resistor, a comparator, a voltage-divider circuit, and/or any other sensing means.

In the example of FIG. 9, responsive to sensing that the ground fault has occurred, controller 190 controls power converter 140 or 160 based on a second target value that is different than the previous target value (904). Controller 190 can implement the new target value control by changing the duty cycle and/or frequency of the control signals delivered to the switches of power converter 140 or 160. In examples in which electrical power system 100 includes more than one controller, the master controller may determine the occurrence of a ground fault and, responsive to sensing the ground fault, communicate an alert signal to the other controllers. The master controller may also communicate the second target value to the other controllers.

In a first example of FIG. 9, controller 190 can control power converter 140 or 160 based on a target value for differential bus 150 (900). The target value may be a target for the differential voltage across rails 150A and 150B or a target for a single-ended voltage on rail 150A or 150B.

Controller 190 then senses a ground fault on differential bus 150 (902). Controller 190 can monitor the voltage levels of rails 150A and 150B. Controller 190 may determine the occurrence of a ground fault on differential bus 150 in response to sensing that the voltage level of rail 150A or 150B is equal to a ground level. Controller 190 may also determine the occurrence of a ground fault on differential bus 150 in response to sensing that the voltage level of rail 150A or 150B is within a threshold voltage of the ground level, where the threshold voltage can be positive or negative five, ten, or twenty volts or any other suitable threshold voltage.

Responsive to sensing that the ground fault has occurred on differential bus 150, controller 190 controls power converter 140 or 160 based on a second target value that is different than the previous target value (904). In some examples, the second target value is less than the first target value. For example, the second target value may be one half of the voltage, current, or power of the first target value.

In a second example of FIG. 9, controller 190 can control power converter 140 based on a target value for the terminal voltage of electric generator 120 (900). The terminal voltage may be the voltage difference between, e.g., the terminal on line 130A and the terminal on line 130B. Controller 190 may be configured to monitor the voltage levels on lines 130A-130C to achieve the target value for the terminal voltage of electric generator 120.

Controller 190 may sense a ground fault on one of lines 130A-130C (902). Controller 190 may determine the occurrence of a ground fault on multiphase lines 130 in response to sensing that the voltage level of one of lines 130A-130C is equal to a ground level. Controller 190 may also determine the occurrence of a ground fault on multiphase lines 130 in response to sensing that the voltage level of one of lines 130A-130C is within a threshold voltage of the ground level, where the threshold voltage can be positive or negative five, ten, or twenty volts or any other suitable threshold voltage.

Responsive to sensing that the ground fault has occurred on multiphase lines 130, controller 190 controls power converter 140 based on a second target value for the terminal voltage that is different than the previous target value (904). In some examples, the second target value is less than the first target value. In examples in which electrical power system 100 includes two sets of multiphase lines coupled to electric generator 120, controller 190 uses a healthy set of multiphase lines to inject negative sequence EMF.

In a third example of FIG. 9, controller 190 can control power converter 140 or 160 based on a target value for the differential voltage across rails 150A and 150B (900). The differential voltage is the difference between the voltage level on rail 150A and the voltage level on rail 150B. Controller 190 then senses a ground fault on one of lines 130A-130C (902).

Responsive to sensing that the ground fault has occurred on multiphase lines 130, controller 190 controls power converter 140 or 160 based on a second target value for a single-ended voltage on rail 150A or 150B (904). Controller 190 can switch from controlling power converter 140 or 160 to achieve a differential target value for differential bus 150 to controlling power converter 140 or 160 to achieve a single-ended target value for differential bus 150. A ground fault on one of lines 130A-130C may cause the differential voltage across differential bus 150 to remain nearly constant while the single-ended voltages on rails 150A and 150B oscillate. Thus, switching from a differential target value to a single-ended target value can reduce the maximum amplitude of the voltage swings on each of rails 150A and 150B.

The following numbered examples demonstrate one or more aspects of the disclosure.

Example 1

An electrical power system includes a differential bus, a power converter coupled to the differential bus, and a controller configured to control the power converter based on a first target value for the differential bus. The controller is also configured to sense that a ground fault has occurred in the electrical power system while controlling the power converter based on the first target value. The controller is further configured to, responsive to sensing that the ground fault has occurred, control the power converter based on a second target value for the differential bus, the second target value being different than the first target value.

Example 2

The electrical power system of example 1, the controller is configured to control the power converter based on the first target value at least in part by controlling a differential voltage on the differential bus based on the first target value.

Example 3

The electrical power system of any combination of examples 1-2, the controller is configured to control the power converter based on the second target value at least in part by controlling the differential voltage based on the second target value.

Example 4

The electrical power system of any combination of examples 1-3, further including an electric generator.

Example 5

The electrical power system of any combination of examples 1-4, the controller is further configured to control a terminal voltage of the electric generator based on a third target value for the terminal voltage.

Example 6

The electrical power system of any combination of examples 1-5, the controller is further configured to, responsive to sensing that the ground fault has occurred, control the terminal voltage of the electric generator to a fourth target value for the terminal voltage, the fourth target value being different than the third target value.

Example 7

The electrical power system of any combination of examples 1-6, the controller is configured to sense that the ground fault has occurred at least in part by sensing that the ground fault has occurred on the differential bus.

Example 8

The electrical power system of any combination of examples 1-7, the controller is configured to control the power converter based on the first target value at least in part by controlling a differential voltage on the differential bus based on the first target value.

Example 9

The electrical power system of any combination of examples 1-8, the controller is configured to control the power converter based on the second target value at least in part by controlling a single-ended voltage of the differential bus based on the second target value.

Example 10

The electrical power system of any combination of examples 1-9, the power converter circuit includes a three-level power converter coupled to the differential bus, the three-level power converter circuit including a positive rail of the differential bus, a negative rail of the differential bus, and a ground rail.

Example 11

The electrical power system of any combination of examples 1-10, the controller is configured to control the three-level power converter at least in part by controlling a difference between a voltage level on the positive rail and a voltage level on the ground rail.

Example 12

The electrical power system of any combination of examples 1-11, further including a set of multiphase lines coupled to the power converter.

Example 13

The electrical power system of any combination of examples 1-12, the controller is configured to sense that the ground fault has occurred at least in part by sensing that the ground fault has occurred on the set of multiphase lines.

Example 14

The electrical power system of any combination of examples 1-13, the controller is a first controller, and the power converter is a first power converter, and the electrical power system further includes a second power converter coupled to the differential bus and a second controller configured to control the second power converter based on the first target value for the differential bus.

Example 15

The electrical power system of any combination of examples 1-14, the first controller is further configured to, responsive to sensing that the ground fault has occurred, communicate an alert signal to the second controller, and the second controller is further configured to, responsive to receiving the alert signal from the first controller, control the second power converter based on the second target value.

Example 16

The electrical power system of any combination of examples 1-15, the controller is configured to control the power converter based on the first target value at least in part by controlling the power converter based on a first power limit for the differential bus.

Example 17

The electrical power system of any combination of examples 1-16, the controller is configured to control the power converter based on the second target value at least in part by controlling the differential bus based on a second power limit, the second power limit being different than the first power limit.

Example 18

A method for controlling an electrical power system includes controlling, by a controller of the electrical power system, a power converter of the electrical power system based on a first target value for a differential bus of the electrical power system, the differential bus being coupled to the power converter. The method also includes sensing, by the controller, that a ground fault has occurred in the electrical power system while controlling the power converter based on the first target value. The method further includes responsive to sensing that the ground fault has occurred, controlling, by the controller, the power converter based on a second target value for the differential bus, the second target value being different than the first target value.

Example 19

The method of example 18, controlling the power converter based on the first target value includes controlling a differential voltage on the differential bus based on the first target value.

Example 20

The method of any combination of examples 18-19, controlling the power converter based on the second target value includes controlling the differential voltage based on the second target value.

Example 21

The method of any combination of examples 18-20, further including controlling a terminal voltage of the electric generator based on a third target value for the terminal voltage.

Example 22

The method of any combination of examples 18-21, further including, responsive to sensing that the ground fault has occurred, controlling the terminal voltage of the electric generator to a fourth target value for the terminal voltage, the fourth target value being different than the third target value.

Example 23

The method of any combination of examples 18-22, sensing that the ground fault has occurred includes sensing that the ground fault has occurred on the differential bus.

Example 24

The method of any combination of examples 18-23, controlling the power converter based on the first target value includes controlling a differential voltage on the differential bus based on the first target value.

Example 25

The method of any combination of examples 18-24, controlling the power converter based on the second target value includes controlling a single-ended voltage of the differential bus based on the second target value.

Example 26

The method of any combination of examples 18-25, further including controlling a three-level power converter at least in part by controlling a difference between a voltage level on a positive rail and a voltage level on a ground rail.

Example 27

The method of any combination of examples 18-26, sensing that the ground fault has occurred includes sensing that the ground fault has occurred on the set of multiphase lines.

Example 28

The method of any combination of examples 18-27, further including, responsive to sensing that the ground fault has occurred, communicating an alert signal to a second controller, where the second controller is configured to, responsive to receiving the alert signal from the first controller, control the second power converter based on the second target value.

Example 29

The method of any combination of examples 18-28, controlling the power converter based on the first target value includes controlling the power converter based on a first power limit for the differential bus.

Example 30

The method of any combination of examples 18-29, controlling the power converter based on the second target value includes controlling the differential bus based on a second power limit, the second power limit being different than the first power limit.

Example 31

A device includes a computer-readable medium having executable instructions stored thereon, configured to be executable by processing circuitry for causing the processing circuitry to control a power converter of the electrical power system based on a first target value for a differential bus of the electrical power system, the differential bus being coupled to the power converter. The instructions are further configured to cause the processing circuitry to sense that a ground fault has occurred in the electrical power system while controlling the power converter based on the first target value. The instructions are also configured to cause the processing circuitry to, responsive to sensing that the ground fault has occurred, control the power converter based on a second target value for the differential bus, the second target value being different than the first target value.

Example 32

The device of example 31, the instructions to control the power converter based on the first target value include the instructions to control a differential voltage on the differential bus based on the first target value.

Example 33

The device of any combination of examples 31-32, the instructions to control the power converter based on the second target value include instructions to control the differential voltage based on the second target value.

Example 34

The device of any combination of examples 31-33, the instructions are further configured to cause the processing circuitry to control a terminal voltage of the electric generator based on a third target value for the terminal voltage.

Example 35

The device of any combination of examples 31-34, the instructions are further configured to cause the processing circuitry to, responsive to sensing that the ground fault has occurred, control the terminal voltage of the electric generator to a fourth target value for the terminal voltage, the fourth target value being different than the third target value.

Example 36

The device of any combination of examples 31-35, the instructions to sense that the ground fault has occurred include instructions to sense that the ground fault has occurred on the differential bus.

Example 37

The device of any combination of examples 31-36, the instructions to control the power converter based on the first target value include instructions to control a differential voltage on the differential bus based on the first target value.

Example 38

The device of any combination of examples 31-37, the instructions to control the power converter based on the second target value include instructions to control a single-ended voltage of the differential bus based on the second target value.

Example 39

The device of any combination of examples 31-38, the instructions are further configured to cause the processing circuitry to control a three-level power converter at least in part by controlling a difference between a voltage level on a positive rail and a voltage level on a ground rail.

Example 40

The device of any combination of examples 31-39, the instructions to sense that the ground fault has occurred include instructions to sense that the ground fault has occurred on the set of multiphase lines.

Example 41

The device of any combination of examples 31-40, the instructions are further configured to cause the processing circuitry to, responsive to sensing that the ground fault has occurred, communicate an alert signal to a second controller, where the second controller is configured to, responsive to receiving the alert signal from the first controller, control the second power converter based on the second target value.

Example 42

The device of any combination of examples 31-41, the instructions to control the power converter based on the first target value include instructions to control the power converter based on a first power limit for the differential bus.

Example 43

The device of any combination of examples 31-42, the instructions to control the power converter based on the second target value include instructions to control the differential bus based on a second power limit, the second power limit being different than the first power limit.

Example 44

A method for controlling an electrical power system including an electric generator, where the method includes controlling, by a controller of the electrical power system, a terminal voltage of the electric generator based on a first target voltage value for the terminal voltage. The method also includes sensing, by the controller, that a ground fault has occurred in the electrical power system while controlling the terminal voltage based on the first target voltage value. The method further includes responsive to sensing that the ground fault has occurred, controlling, by the controller, the terminal voltage of the electric generator based on a second target voltage value for the terminal voltage, the second target voltage value being different than the first target voltage value.

Example 45

The method of example 44, further including the method of examples 18-30 or any combination thereof.

Example 46

An electrical power system includes an electric generator, a power converter coupled to the electric generator, and a controller configured to control a terminal voltage of the electric generator based on a first target voltage value for the terminal voltage. The controller is further configured to sense that a ground fault has occurred in the electrical power system while controlling the terminal voltage based on the first target voltage value. The controller is also configured to, responsive to sensing that the ground fault has occurred, control the terminal voltage of the electric generator based on a second target voltage value for the terminal voltage, the second target voltage value being different than the first target voltage value.

Example 47

The electrical power system of example 46, wherein the controller is configured to perform the method of examples 18-30 or any combination thereof.

Example 48

A device includes a computer-readable medium having executable instructions stored thereon, configured to be executable by processing circuitry for causing the processing circuitry to control a terminal voltage of an electric generator based on a first target voltage value for the terminal voltage. The instructions are further configured to cause the processing circuitry to sense that the ground fault has occurred in the electrical power system while controlling the terminal voltage based on the first target voltage value. The instructions are further configured to cause the processing circuitry to control the terminal voltage of the electric generator based on a second target voltage value for the terminal voltage, the second target voltage value being different than the first target voltage value.

Example 49

The device of example 48, wherein the instructions are configured to cause the processing circuitry to perform the method of examples 18-30 or any combination thereof.

Various examples have been described. Any combination of the described systems, operations, or functions is contemplated. These and other examples are within the scope of the following claims.

What is claimed is:
1. An electrical power system comprising:
a differential bus;
a power converter coupled to the differential bus; and
a controller configured to:
control the power converter based on a first target value for the differential bus at least in part by controlling a differential voltage on the differential bus based on the first target value;
sense that a ground fault has occurred in the electrical power system while controlling the power converter based on the first target value; and
responsive to sensing that the ground fault has occurred, control the power converter based on a second target value for the differential bus at least in part by controlling a single-ended voltage of the differential bus based on the second target value, the second target value being different than the first target value.

2. The electrical power system of claim 1, further comprising an electric generator, wherein the controller is further configured to:
control a terminal voltage of the electric generator based on a third target value for the terminal voltage; and
responsive to sensing that the ground fault has occurred, control the terminal voltage of the electric generator to a fourth target value for the terminal voltage, the fourth target value being different than the third target value.

3. The electrical power system of claim 1, wherein the controller is configured to sense that the ground fault has occurred at least in part by sensing that the ground fault has occurred on the differential bus.

4. The electrical power system of claim 1,
wherein the power converter circuit comprises a three-level power converter coupled to the differential bus, the three-level power converter circuit including a positive rail of the differential bus, a negative rail of the differential bus, and a ground rail, and
wherein the controller is configured to control the three-level power converter at least in part by controlling a difference between a voltage level on the positive rail and a voltage level on the ground rail.

5. The electrical power system of claim 4,
wherein controller is configured to control the three-level power converter to achieve a first single-ended voltage target for the difference between the positive rail and the ground rail, and
wherein controller is configured to control the three-level power converter to achieve a second single-ended voltage target for a difference between the negative rail and the ground rail.

6. The electrical power system of claim 1, further comprising a set of multiphase lines coupled to the power converter,
wherein the controller is configured to sense that the ground fault has occurred at least in part by sensing that the ground fault has occurred on the set of multiphase lines.

7. The electrical power system of claim 1, wherein the controller is a first controller, and wherein the power converter is a first power converter, the electrical power system further comprising:
a second power converter coupled to the differential bus; and
a second controller configured to control the second power converter based on the first target value for the differential bus,
wherein the first controller is further configured to, responsive to sensing that the ground fault has occurred, communicate an alert signal to the second controller, and
wherein the second controller is further configured to, responsive to receiving the alert signal from the first controller, control the second power converter based on the second target value.

8. The electrical power system of claim 1,
wherein the controller is configured to control the power converter based on the first target value at least in part by controlling the power converter based on a first power limit for the differential bus, and wherein the controller is configured to control the power converter based on the second target value at least in part by controlling the differential bus based on a second power limit, the second power limit being different than the first power limit.

9. The electrical power system of claim 1, wherein the second target value is less than the first target value.

10. The electrical power system of claim 1, wherein the controller is configured to monitor the single-ended voltage by at least monitoring:
a difference between a positive rail of the differential bus and a ground rail; or
a difference between a negative rail of the differential bus and the ground rail.

11. The electrical power system of claim 1,
wherein the power converter circuit comprises a three-level power converter coupled to the differential bus, the three-level power converter circuit including a positive rail of the differential bus, a negative rail of the differential bus, and a ground rail, and
wherein the controller is configured to control the three-level power converter at least in part by controlling a difference between a voltage level on the negative rail and a voltage level on the ground rail.

12. A method for controlling an electrical power system, the method comprising:
controlling, by a controller of the electrical power system, a power converter of the electrical power system based on a first target value for a differential bus of the electrical power system at least in part by controlling a differential voltage on the differential bus based on the first target value, the differential bus being coupled to the power converter;
sensing, by the controller, that a ground fault has occurred in the electrical power system while controlling the power converter based on the first target value; and
responsive to sensing that the ground fault has occurred, controlling, by the controller, the power converter based on a second target value for the differential bus at least in part by controlling a single-ended voltage of the differential bus based on the second target value, the second target value being different than the first target value.

13. The method of claim 12,
wherein the power converter comprises a three-level power converter coupled to the differential bus, the three-level power converter including a positive rail of the differential bus, a negative rail of the differential bus, and a ground rail, and
wherein controlling the three-level power converter comprises controlling a difference between a voltage level on the positive rail and a voltage level on the ground rail.

14. The method of claim 12, further comprising:
controlling a terminal voltage of an electric generator of the electrical power system based on a third target value for the terminal voltage; and
responsive to sensing that the ground fault has occurred, controlling the terminal voltage of the electric generator based on a fourth target value for the terminal voltage, the fourth target value being different than the third target value.

15. The method of claim 12, further comprising, responsive to sensing that the ground fault has occurred, communicating an alert signal to a second controller, wherein the second controller is further configured to, responsive to receiving the alert signal from the first controller, control the second power converter based on the second target value.

16. The method of claim 12,
wherein controlling the power converter based on the first target value comprises controlling the power converter based on a first power limit for the differential bus, and
wherein controlling the power converter based on the second target value comprises controlling the differential bus based on a second power limit, the second power limit being different than the first power limit.

17. The method of claim 12, wherein the second target value is less than the first target value.

18. A device comprising a computer-readable medium having executable instructions stored thereon, configured to be executable by processing circuitry for causing the processing circuitry to:
control a power converter of the electrical power system based on a first target value for a differential bus of the electrical power system at least in part by controlling a differential voltage on the differential bus based on the first target value, the differential bus being coupled to the power converter;
sense that a ground fault has occurred in the electrical power system while controlling the power converter based on the first target value; and
responsive to sensing that the ground fault has occurred, control the power converter based on a second target value for the differential bus at least in part by controlling a single-ended voltage of the differential bus based on the second target value, the second target value being different than the first target value.

19. The device of claim 18, wherein the instructions are further configured to cause the processing circuitry to:
control a terminal voltage of an electric generator of the electrical power system based on a third target value for the terminal voltage; and
responsive to sensing that the ground fault has occurred, control the terminal voltage of the electric generator based on a fourth target value for the terminal voltage, the fourth target value being different than the third target value.

20. The device of claim 18, wherein the second target value is less than the first target value.

* * * * *